United States Patent
Karaki

(10) Patent No.: US 6,747,897 B2
(45) Date of Patent: Jun. 8, 2004

(54) SEMICONDUCTOR CHARGE PUMP CIRCUIT AND NONVOLATILE SEMICONDUCTOR MEMORY DEVICE

(75) Inventor: Satoru Karaki, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/208,172

(22) Filed: Jul. 29, 2002

(65) Prior Publication Data

US 2003/0057469 A1 Mar. 27, 2003

(30) Foreign Application Priority Data

Aug. 1, 2001 (JP) .................................. 2001-234280

(51) Int. Cl.$^7$ .............................................. G11C 16/04
(52) U.S. Cl. ............. 365/185.18; 365/226; 365/189.09; 365/185.05; 365/185.27; 327/530
(58) Field of Search ...................... 365/185.18, 185.05, 365/185.27, 189.09, 226; 327/530

(56) References Cited

U.S. PATENT DOCUMENTS 5,483,486 A * 1/1996 Javanifard et al. ..... 365/185.17
5,774,012 A * 6/1998 Im .............................. 327/536
6,441,678 B1 * 8/2002 Zeng et al. .................. 327/536

FOREIGN PATENT DOCUMENTS

JP          10-075568          3/1998

* cited by examiner

Primary Examiner—Connie C. Yoha
(74) Attorney, Agent, or Firm—Morrison & Foerster LLP

(57) ABSTRACT

A charge pump circuit includes inverters INV1 and INV2. The inverter INV1 receives a clock signal CLK2, and applies a voltage waveform at an immediately previous node to a second end of a capacitor connected to a transistor and to the p-well thereof. The voltage of the capacitor on the side of the control terminal of the transistor, and the voltage waveform at the node, are raised with the same phase timing as the clock signal CLK1. The inverter INV2 receives a clock signal CLK1, and applies a voltage waveform at an immediately previous node to a second end of another capacitor connected to another transistor and to the p-well thereof. The voltage of the another capacitor on the side of the control terminal of the another transistor, and the voltage waveform at the node, are raised with the same phase timing as the clock signal CLK2.

9 Claims, 11 Drawing Sheets

CONVENTIONAL ART

CONVENTIONAL ART

CONVENTIONAL ART

CONVENTIONAL ART

SEMICONDUCTOR CHARGE PUMP CIRCUIT AND NONVOLATILE SEMICONDUCTOR MEMORY DEVICE

BACKGROUND OF THE INVENTION

1. Field of the Invention

The present invention relates to a semiconductor charge pump circuit for generating a voltage which is higher than a supply voltage or a negative voltage, and a nonvolatile semiconductor memory device including such a semiconductor charge pump circuit.

2. Description of the Related Art

Conventionally, semiconductor memories, for example, EEPROMs (Electrically Erasable and Programmable Read Only Memories) and flash memories, require a voltage which is higher than a supply voltage or a negative voltage for read/write/erase operations. One of the following two methods are used to generate such a voltage: (i) applying an external voltage; and (ii) pumping a supply voltage by a charge pump circuit provided in a chip. Recently, the method of pumping a supply voltage by a charge pump circuit provided in a chip has become the method of choice since chips mostly include only one power supply today.

A basic principle of operation of a charge pump circuit will be described. FIG. 9 shows a change in the voltage of a capacitor C1 used for pumping. In an initial state, a first end of the capacitor C1 is supplied with 0 V, and a second end of the capacitor C1 is supplied with a supply voltage Vcc.

When the potential of the first end is changed from 0 V to the supply voltage Vcc, the supply voltage Vcc of the second end is doubled to 2×Vcc. Namely, the voltage of the second end is pumped to 2×Vcc. This is represented by expression (1).

$$Q1 = C \times V_{cc}$$
$$Q2 = C \times (2V_{cc} - V_{cc}) = CV_{cc} \qquad (1)$$

In expression (1), letter C represents the capacitance of the capacitor C1. Expression (1) represents Q1=Q2; i.e., "conservation of charge". The above-described basic principle of operation of a charge pump circuit can be applied to an LSI circuit. One generally known charge pump circuit for an LSI is a Dickson-type charge pump circuit.

FIG. 10 shows a representative configuration of a conventional Dickson-type charge pump circuit. In the example shown in FIG. 10, the conventional Dickson-type charge pump circuit includes five n-type MOS (metal-oxide-semiconductor) transistors D0 through D4 and four capacitors C1 through C4.

A basic pump cell of the Dickson-type charge pump circuit shown in FIG. 10 includes, for example, one capacitor C1 and one n-type MOS transistor D1, which are surrounded by a dashed line in FIG. 10. Four such basic pump cells, each including one capacitor (C1, C2, C3, C4) and one n-type MOS transistor (D1, D2, D3, D4), are connected in series so as to form the charge pump circuit.

The first-stage transistor D0 has a drain D and a gate G which are both connected to an output end of a power supply (supply voltage Vcc: for example, 3V). The transistor D0 acts as a backflow preventing valve for preventing an electric current from backflowing from a node N1 toward the power supply Vcc. The node N1 is connected to a source of the transistor D0 and has a pumped-up voltage.

The charge pump circuit receives clock signals CLK1 and CLK2 as input signals. The clock signal CLK1 is input to the capacitors C1 and C3, and the clock signal CLK2 is input to the capacitors C2 and C4. FIG. 11 is a timing diagram illustrating waveforms of the clock signals CLK1 and CLK2.

As shown in FIG. 11, the clock signals CLK1 and CLK2 each have an amplitude which is equal to the supply voltage Vcc. The clock signals CLK1 and CLK2 have opposite phases to each other. For example, when the clock signal CLK1 is at the supply voltage Vcc, the clock signal CLK2 is at 0 V. When the clock signal CLK1 is at 0 V, the clock signal CLK2 is at the supply voltage Vcc.

Returning to FIG. 10, a voltage pumped by the charge pump circuit is output from an output node Nout. Although not shown in FIG. 10, the output node Nout is connected to, for example, a regulator or a smoothing capacitor. A voltage which is pumped by the charge pump circuit (a positive high voltage in this example) is output to, for example, the regulator through the output node Nout.

FIG. 12 is a schematic cross-sectional view of an n-MOS transistor.

As shown in FIG. 12, a flash memory generally uses a p-type substrate. The n-type MOS transistor is formed as follows. The p-type substrate is provided with a reference voltage Vss (0 V). A source region S (n+) and a drain region D (n+) are formed in the p-type substrate with a prescribed distance therebetween. A gate G is formed on an area of the p-type substrate which is interposed between the source region S and the drain region D. The p-type substrate and the gate region G have an insulating layer therebetween. A plurality of n-type MOS transistors having such a structure are connected in series so as to form a charge pump circuit as shown in FIG. 10.

FIG. 13 is a timing diagram illustrating ideal waveforms of nodes N1 through N4 of a Dickson-type charge pump. As shown in FIG. 10, the node N1 is provided between the n-type MOS transistor D0 and the N-type MOS transistor D1, the node N2 is provided between the N-type MOS transistor D1 and the N-type MOS transistor D2, the node N3 is provided between the n-type MOS transistor D2 and the N-type MOS transistor D3, and the node N4 is provided between the N-type MOS transistor D3 and the N-type MOS transistor D4.

In an initial state where the capacitors C1 through C4 do not have any charge accumulated therein and the clock signals CLK1 and CLK2 are 0 V, voltages VN1 through VN4 of the nodes N1 through N4 are represented by expression (2).

$$VN1 = V_{cc} - V_{th}$$
$$VN2 = V_{cc} - 2V_{th}$$
$$VN3 = V_{cc} - 3V_{th}$$
$$VN4 = V_{cc} - 4V_{th} \qquad (2)$$

As can be appreciated from expression (2), each time the charge is transferred by an N-type MOS transistor so as to pump up the voltage of anode, the pumped-up voltage of the node is reduced by the threshold voltage Vth of an N-type MOS transistor (for example, about 0.6 V).

As shown in FIG. 13, when the voltage of the clock signal CLK1 is changed from 0 V to Vcc, the voltage of the node N1 is changed to 2Vcc−Vth, and an output voltage of (2Vcc−Vth)−Vth−Vb is transferred by the N-type MOS transistor D1 from the source of the N-type MOS transistor D1 to the node N2. "Vb" represents a voltage drop of the transferred potential, the voltage drop caused by a substrate biasing effect. The voltage drop Vb increases in proportion to the source—substrate voltage $V_{BS}$.

When the voltage of the clock signal CLK2 is changed from 0 V to supply voltage Vcc, the voltage of the node N2 is changed from 2Vcc–2Vth–Vb to 3Vcc–2Vth–Vb.

The above-described operation is repeated up to the node N4 as shown in FIG. 13, and the resultant voltage is output as an output voltage Vout from the charge pump circuit.

The output voltage of such a Dickson-type charge pump circuit (corresponding to the voltage of a node Nout) is represented by expression (3) as described in, for example, "Ki-Hwan Choi et al., 1997 Symposium on VLSI Circuits Digest of Technical Papers, 1997".

$$Vout \text{(conventional)} = \underbrace{Vcc - Vth(0)}_{(a)} + \underbrace{\sum_{i=1}^{n}\{(a)Vcc - Vth(i)\}}_{(b)} \quad (3)$$

In expression (3), Vth(0) represents a threshold voltage of the N-type MOS transistor D0 (for example, Vth=0.6 V), and Vth(i) represents a threshold voltage of the n'th N-type MOS transistor. Term (a) of expression (3), i.e., "Vcc–Vth(0)" is practically "1". "i" is a natural number.

Vth(i) represents a threshold obtained in consideration of the substrate biasing effect. The larger the difference between the voltage of the source and the voltage of the substrate (in this example, the voltage of the p-well) is, the larger the value of Vth(i) is. In expression (3), Vth and Vb are independently represented (Vth+Vb≈Vth). In a structure including multiple-stage pumps, the term (a) of expression (3) is ignored and the effect of the term (b) is important. Based on the term (b), the voltage which is pumped for each stage of pump is represented by expression (4).

$$Vcc-Vth(i) \quad (4)$$

The output voltage Vout of the charge pump circuit is influenced by the margin of the threshold voltage Vth(i) of each transistor and the supply voltage Vcc. Accordingly, when the threshold voltage Vth(i) obtained in consideration of the substrate biasing effect is raised, the voltage which is pumped for each stage of pump is decreased or becomes zero. Therefore, even when the number of the stages of pumps is increased, the output voltage Vout becomes less likely to be increased or is not increased.

For example, in the Dickson-type charge pump circuit shown in FIG. 10, the voltage of the source of the N-type MOS transistor D4 is the output voltage Vout, and the potential of the p-well is Vss (0 V). Therefore, the threshold voltage of the N-type MOS transistor D4 is raised by the substrate biasing effect. Thus, the transfer efficiency, i.e., the pumping efficiency is decreased.

As can be appreciated from the above, a Dickson-type charge pump circuit, which is a general charge pump circuit, has the following two main drawbacks: (1) the threshold voltage is raised due to a substrate biasing effect; and (2) the amplitude of a clock signal for determining the level of pumping is converged to the supply voltage Vcc; i.e., when the supply voltage Vcc is low, the pumping efficiency is decreased.

In order to prevent the above-described drawbacks of the conventional Dickson-type charge pump circuit, the following two are indispensable: (1) restriction of arise in the threshold voltage of the MOS transistors, which is caused by the substrate biasing effect; and (2) an increase in the margin between the supply voltage Vcc and the threshold voltage Vth(i) of the n'th MOS transistor.

In the conventional Dickson-type charge pump circuit, as shown in FIG. 10, the substrate potentials (p-well potentials) of all the N-type MOS transistors D1 through D4 are Vss (0 V), and the amplitudes of the clock signals CLK1 and CLK2 are both equal to the supply voltage Vcc. Therefore, the transfer efficiency of the pumping voltage is deteriorated due to the substrate biasing effect In addition, the first-stage basic pump cell performs pumping only to corresponding to the supply voltage Vcc, which is equal to the amplitude of each clock signal. This also deteriorates the pumping efficiency.

SUMMARY OF THE INVENTION

According to one aspect of the invention, a semiconductor charge pump circuit includes basic pump cells connected in N stages where N is a natural number of equal to or greater than three. Each cell is formed by connecting a control terminal of a transistor and a first driving terminal of the transistor and connecting the control terminal and a first end of a capacitor. The basic pump cells are connected in N stages by connecting a second driving terminal of a transistor of one basic pump cell to a first driving terminal of a transistor of a next-stage basic pump cell. A second end of the capacitor of each basic pump cell receives a clock having a different phase from a clock which is input to the capacitor of an immediately previous-stage basic pump cell and the capacitor of an immediately subsequent-stage basic pump cell. The basic pump cells connected in N stages are driven at a plurality of phase timings so as to pump a voltage. The transistor of at least one of the basic pump cells includes a substrate well. The semiconductor charge pump circuit further includes a switching element for applying, as a clock, a voltage waveform of the basic pump cell, immediately previous to the inverter, to a second end of a capacitor connected to a control end of the transistor including the substrate well and to the substrate well of the transistor during a pumping operation, the voltage waveform being pumped with the same phase timing of that of the voltage of the capacitor on the side of the control terminal of the transistor connected to the capacitor.

In one embodiment of the invention, the basic pump cells connected in N stages include a group of basic pump cells operating with the same timing as each other. An externally input basic clock for transfer is applied, as a voltage waveform, to a substrate well of a transistor, and to a second end of a capacitor, of a first-stage basic pump cell of the group of basic pump cells.

In one embodiment of the invention, two-phase clocks having opposite phases to each other are used.

In one embodiment of the invention, the switching element is an inverter circuit including a P-type MOS transistor and an N-type MOS transistor, and switches between the voltage waveform of the basic pump cell immediately previous to the inverter circuit and a reference voltage, in accordance with the level of the clock.

In one embodiment of the invention, a difference between (i) a voltage applied to at least one of the substrate well of the transistor or the second end of the capacitor connected to the transistor during the pumping operation, and (ii) the voltage pumped with the same phase timing as the voltage is restricted up to a threshold voltage of the P-type MOS transistor.

In one embodiment of the invention, the basic pump cells connected in N stages include at least one basic pump cell, having an N-type MOS transistor formed in and on a p-substrate, and at least one basic pump cell, having an N-type MOS transistor formed in and on a p-well which is electrically separated from the p-substrate.

In one embodiment of the invention, the semiconductor charge pump circuit has a triple-well structure in which the p-well is surrounded by an n-well so as to be separated from the p-substrate, the semiconductor charge pump circuit further comprising at least one transistor in and on the p-substrate.

According to another aspect of the invention, a nonvolatile semiconductor memory device includes any one of the above-described semiconductor charge pump circuits.

According to the present invention, a switching element such as, for example, an inverter circuit is added to the conventional Dickson-type charge pump circuit so as to increase the amplitude of a clock signal, and the clock signal is input to a substrate well of an N-type MOS transistor. Thus, the pumping capability and the pumping efficiency are improved. A charge pump circuit according to the present invention has an improved transfer efficiency of the pumping voltage as compared to the conventional Dickson-type charge pump circuit, and realizes efficient pumping even with a low voltage power supply.

Thus, the invention described herein makes possible the advantages of providing a semiconductor charge pump circuit for improving the transfer efficiency of the pumping voltage over the conventional Dickson-type charge pump circuit so as to be capable of pumping even with a low voltage power supply, and a nonvolatile second memory device including such a semiconductor charge pump circuit.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings. In a first example and a second example of the present invention, an exemplary semiconductor charge pump circuit will be described. In a third example of the present invention, an exemplary flash memory including the semiconductor charge pump circuit will be described.

EXAMPLE 1

Figure 1:
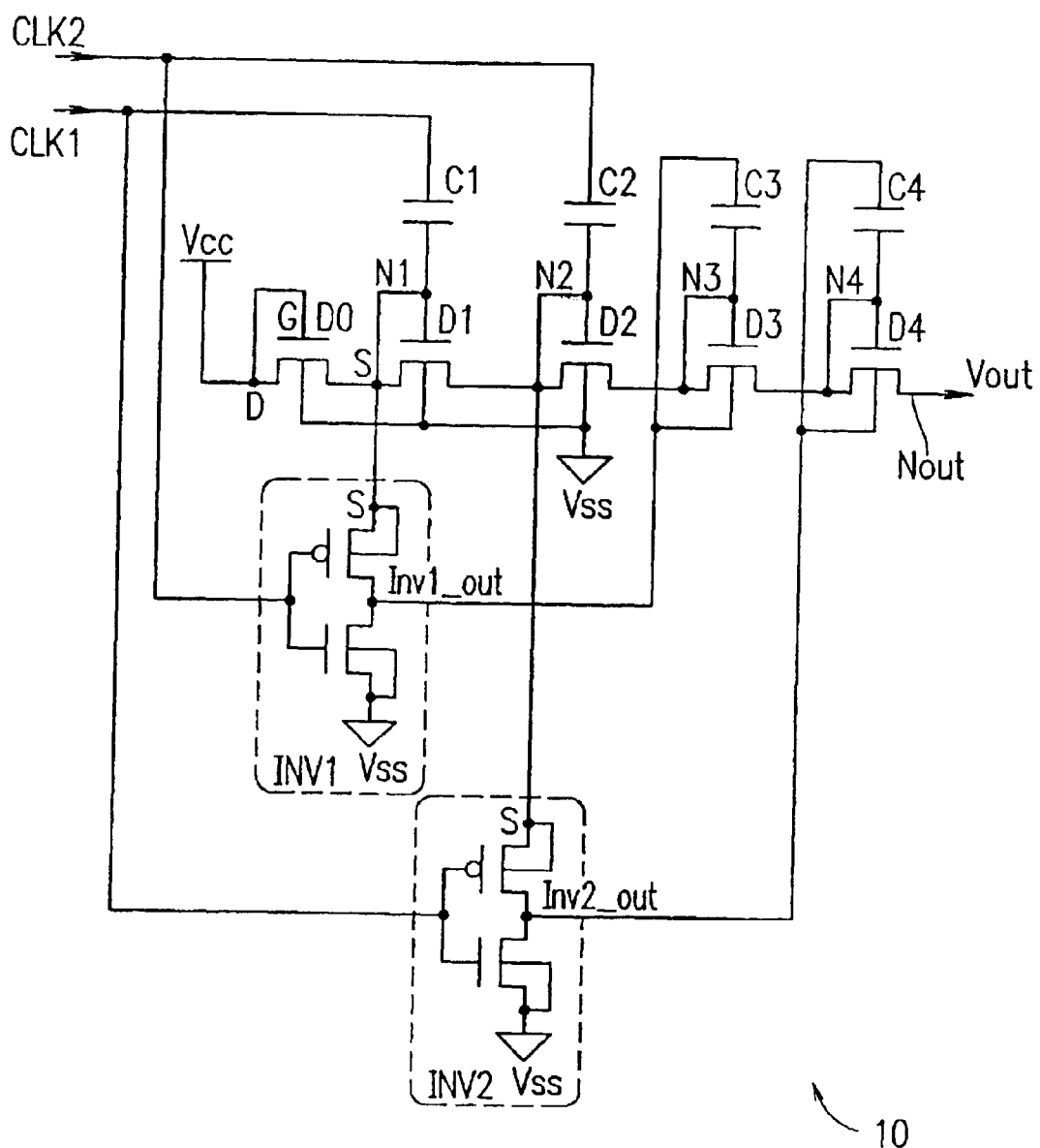
FIG. 1 is a circuit diagram illustrating a part of a semiconductor charge pump circuit according to a first example of the present invention.
Figure 10:
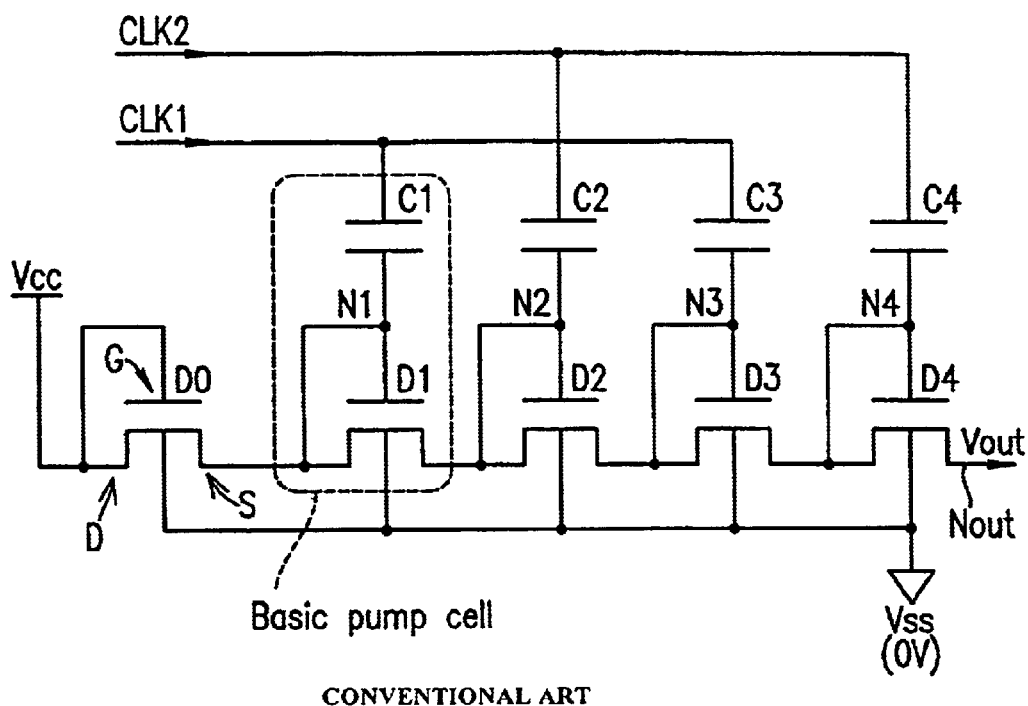
FIG. 10 is a circuit diagram illustrating a part of a conventional Dickson-type charge pump circuit.
Figure 11:
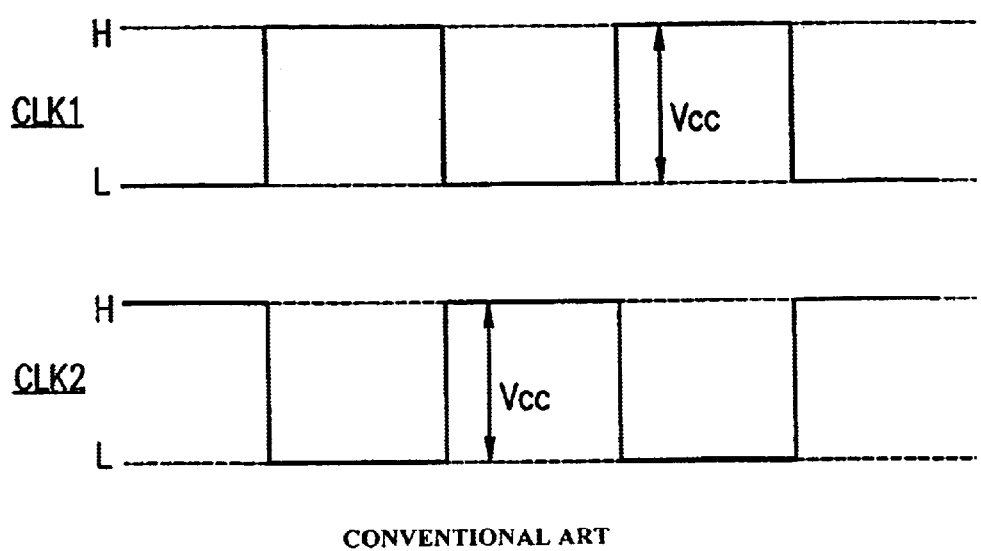
FIG. 11 is a timing diagram illustrating waveforms of clock signals shown in FIG. 10.
Figure 12:
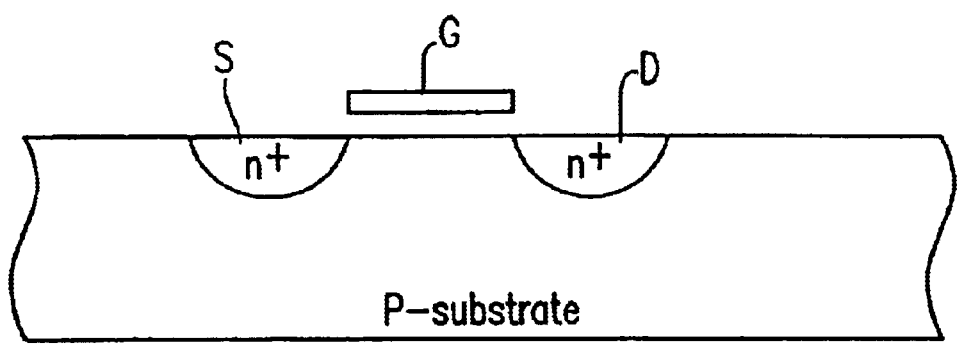
FIG. 12 is a cross-sectional view of an N-type MOS transistor used in the conventional Dickson-type charge pump circuit shown in FIG. 10.

FIG. 1 shows a configuration of a part of a semiconductor charge pump circuit 10 according to the first example of the present invention. Identical elements previously discussed with respect to FIG. 10 bear identical reference numerals and the detailed descriptions thereof will be omitted.

As shown in FIG. 1, the semiconductor charge pump circuit 10 includes five N-type MOS transistors D0 through D4 as voltage transfer sections, four capacitors C1 through C4 as capacitance sections for pumping, and two inverter circuits 1 and 2 as switching elements. Hereinafter, the two inverter circuits 1 and 2 will be referred to as the "inverters INV1 and INV2", respectively.

The inverters INV1 and INV2 provide some of the features of the present invention of (i) increasing the amplitude of clock signals CLK1 and CLK2 as basic clocks for transferring an external input and (ii) reducing the substrate biasing effect. These features of the present invention will be described in detail.

The clock signal CLK2 is input to an input end of the inverter INV1, and the clock signal CLK1 is input to an input end of the inverter INV2. The inverter INV1 includes a P-type MOS transistor, and a source S of the P-type MOS transistor is connected to a node N1. The inverter INV2 includes a P-type MOS transistor, and a source S of the P-type MOS transistor is connected to a node N2.

An output end INV1_out of the inverter INV1 is connected to an input end (a second end) of the capacitor C3 and to a substrate well end of the N-type MOS transistor D3. (A substrate well end of each of the N-type MOS transistors D0 through D4 is a p-type well in the substrate (described below with reference to FIG. 2), and hereinafter, will be referred to as the "p-well".) An output end INV2_out of the inverter INV2 is connected to an input end (a second end) of the capacitor C4 and to a p-well of the N-type MOS transistor D4.

During a pumping operation, the inverter INV1 switches the voltage to be applied to the input end of the capacitor C3 and to the p-well of the N-type MOS transistor D3, from the reference voltage Vss (0 V) to that of a voltage waveform of the node N1 (in the immediately previous stage), which has been risen with the same phase timing with the voltage of the capacitor C3 on the side of the control terminal of the N-type MOS transistor D3 connected to the capacitor C3. The switching is performed in accordance with the voltage level of the clock signal CLK2. The input end of the capacitor C3 is connected to a gate of the N-type MOS transistor D3 which acts as a control terminal of the N-type MOS transistor D3.

During the pumping operation, the inverter INV2 switches the voltage to be applied to the input end of the capacitor C4 and to the p-well of the N-type MOS transistor D4 from the reference voltage Vss (0 V) to a voltage waveform of the node N2 (in the immediately previous stage), which has been risen with the same phase timing with the voltage of the capacitor C4 on the side of the control terminal of the N-type MOS transistor D4 connected to the capacitor C4. The switching is performed in accordance with the voltage level of the clock signal CLK1. The input end of the capacitor C4 is connected to a gate of the N-type MOS transistor D4 which acts as a control terminal of the N-type MOS transistor D4.

A basic pump cell structure of the charge pump circuit 10 includes, for example, one capacitor and one N-type MOS transistor, like the conventional Dickson-type charge pump circuit. The charge pump circuit 10 in this example includes four basic pump cells, each including one capacitor (C1, C2, C3, C4) and one n-type MOS transistor (D1, D2, D3, D4), for easy comparison with the conventional Dickson-type charge pump circuit. The basic pump cell including the capacitor C1 and the N-type MOS transistor D1 and the basic pump cell including the capacitor C3 and the N-type MOS transistor D3 form a group of basic pump cells. The basic pump cell including the capacitor C2 and the N-type MOS transistor D2 and the basic pump cell including the capacitor C4 and the N-type MOS transistor D4 form another group of basic pump cells.

Figure 13:
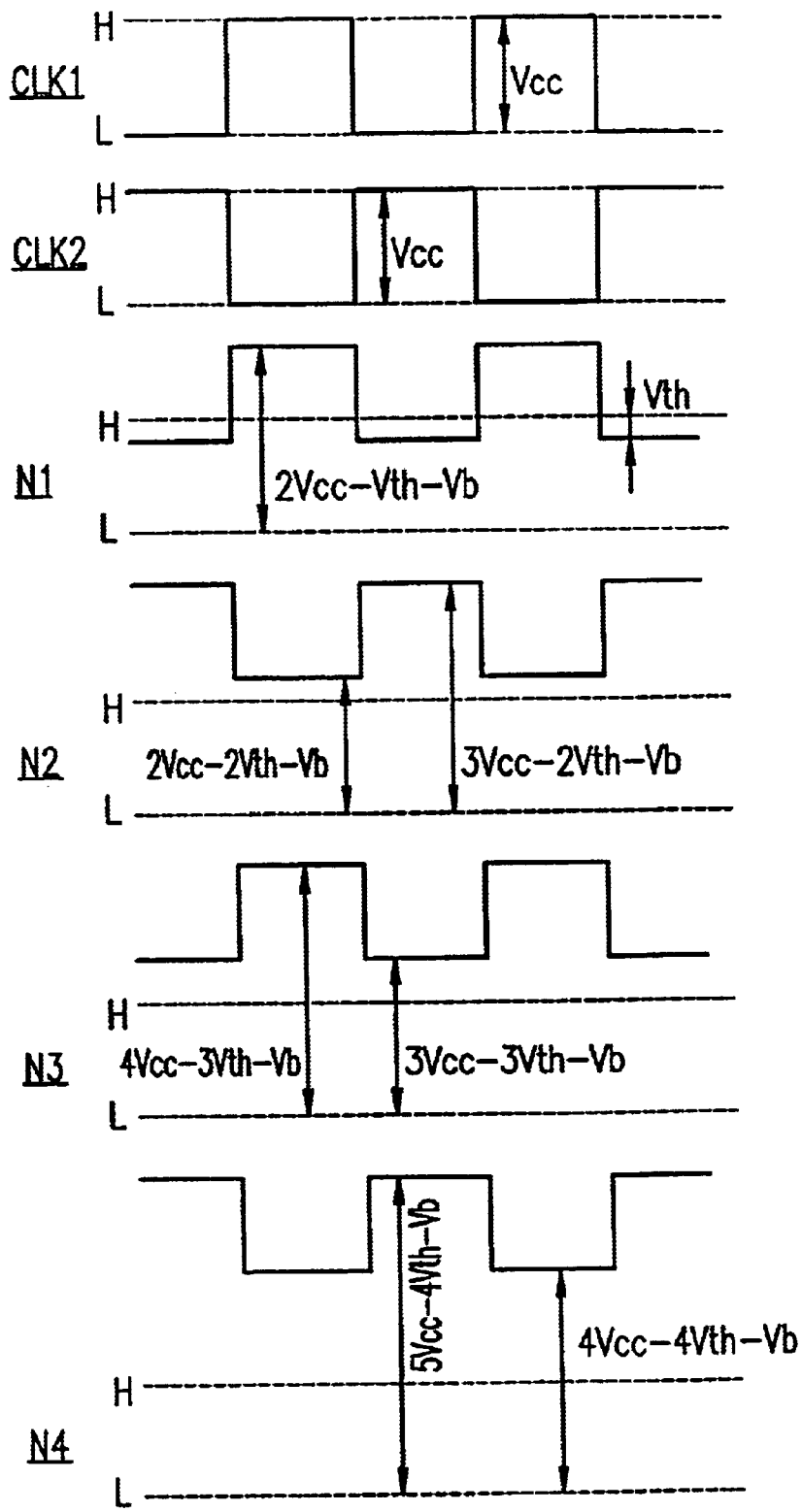
FIG. 13 is a timing diagram illustrating ideal waveforms of various parts of the conventional Dickson-type charge pump circuit shown in FIG. 10.

A first-stage N-type MOS transistor D0 having a drain D and a gate G which are connected to a power supply (voltage: Vcc) acts as a backflow preventing valve, like in the conventional Dickson-type charge pump circuit. Also like the conventional Dickson-type charge pump circuit, the charge pump circuit 10 receives clock signals CLK1 and CLK2. The clock signals CLK1 and CLK2 which are input to the charge pump circuit 10 are two-phase clock signals having opposite phases from each other, like those shown in FIG. 13. An output voltage Vout of the charge pump circuit 10 is output from a node Nout. Although not shown in FIG. 1, the node Nout is connected to, for example, a regulator or a smoothing capacitor. A voltage which is pumped by the charge pump circuit 10 (a positive high voltage in this example) is output to, for example, the regulator.

Figure 2:
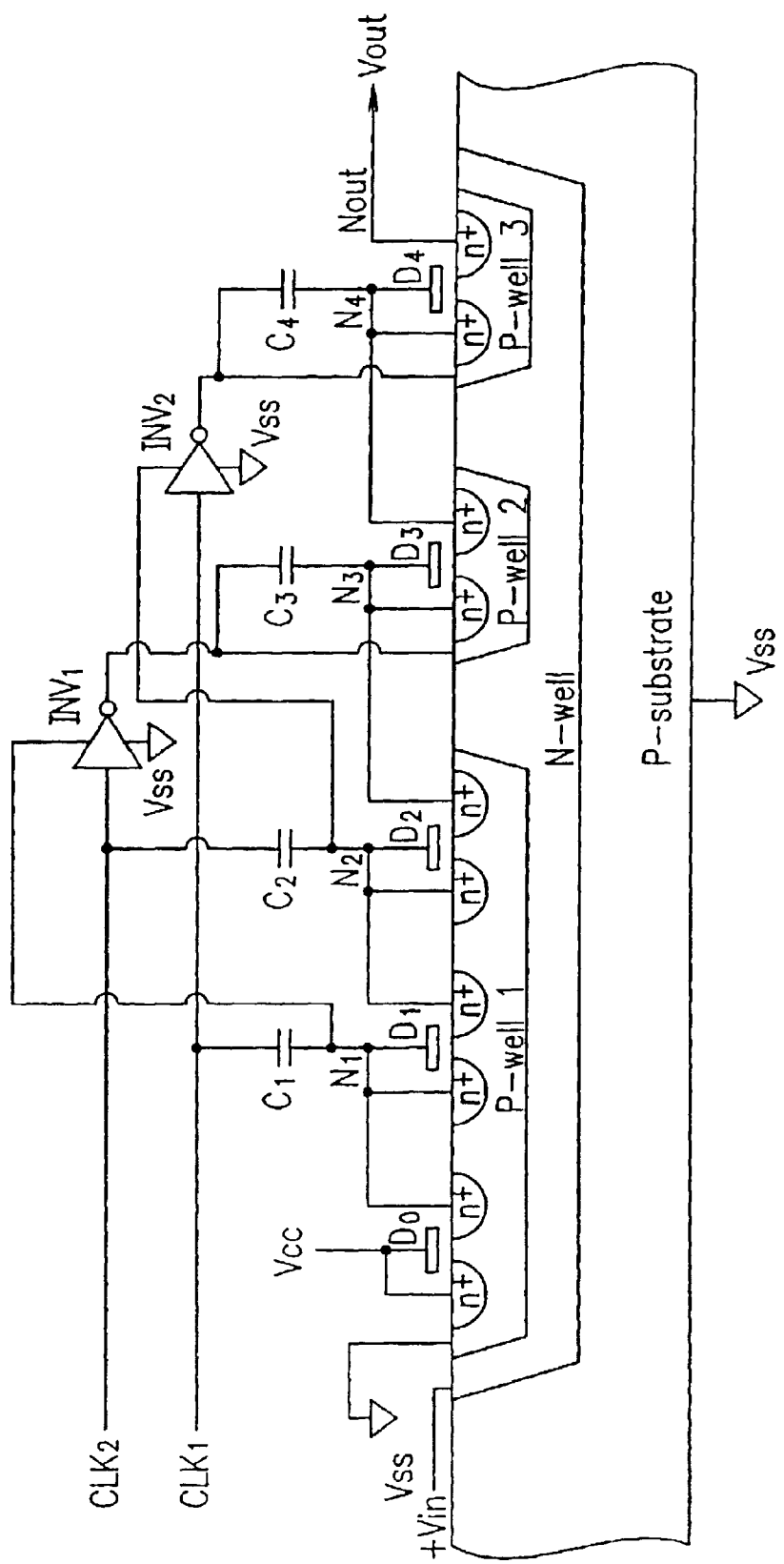
FIG. 2 shows an exemplary structure of the charge pump circuit shown in FIG. 1 together with a cross-sectional view of N-type MOS transistors D0 through D4.

FIG. 2 shows an exemplary structure of the charge pump circuit shown in FIG. 1 together with a schematic cross-sectional view of N-type MOS transistors D0 through D4.

As shown in FIG. 2, the charge pump circuit 10 includes a P-type MOS substrate (hereinafter, referred to as the "p-substrate"). In the p-substrate, an N-type substrate well (hereinafter, referred to as the "n-well") is formed. In the n-well, a plurality of p-wells are formed, each of which surrounds a drain region and a source region of one or a plurality of N-type MOS transistors (N-type MOS transistors D0 through D4). Thus, the n-well acts to separate the p-substrate from the p-wells. The p-substrate, the n-well and the plurality of p-wells form a triple-well structure. Each N-type MOS transistor D0, D1, D2, D3, D4 includes the drain region D (n+) as a first driving terminal, the source region S (n+) as a second driving terminal, and a gate G as a control terminal. The gate G is provided on the p-well with an insulating layer interposed therebetween.

In this example, the n-well is formed so as to surround the p-wells. The p-wells are, specifically, a p-well 1 including the drain region D and the source region S of the N-type MOS transistors D0 through D2, a p-well 2 including the drain region D and the source region S of the N-type MOS transistor D3, and a p-well 3 including the drain region D and the source region S of the N-type MOS transistor D4.

The p-well 1 is connected to a reference power supply (reference voltage Vss: 0 V). The p-well 2 is connected to an input end of the capacitor C3 and to an output end of the inverter INV1. The p-well 3 is connected to an input end of the capacitor C4 and to an output end of the inverter INV2.

The clock signal CLK2 is input to an input end of the inverter INV1. A high voltage power supply input end of the inverter INV1 (the source S of the P-type MOS transistor included in the inverter INV1) is connected to the node N1. A low voltage power supply input end of the inverter INV1 (the source S of an N-type MOS transistor included in the inverter INV1) is connected to the reference power supply (reference voltage Vss: 0 V).

The clock signal CLK1 is input to an input end of the inverter INV2. A high voltage power supply input end of the inverter INV2 (the source S of the P-type MOS transistor included in the inverter INV2) is connected to the node N2. A low voltage power supply input end of the inverter INV2 (the source S of an N-type MOS transistor included in the inverter INV2) is connected to the reference power supply (reference voltage Vss: 0 V).

The p-substrate is connected to the reference power supply (reference voltage Vss: 0 V). The n-well is provided with a positive voltage +Vin (in this example, a positive voltage equal to or greater than the output voltage Vout, i.e., the highest voltage among the voltages of the basic pump cells) so as not to allow a forward current to flow through the p-n junction.

Figure 3:
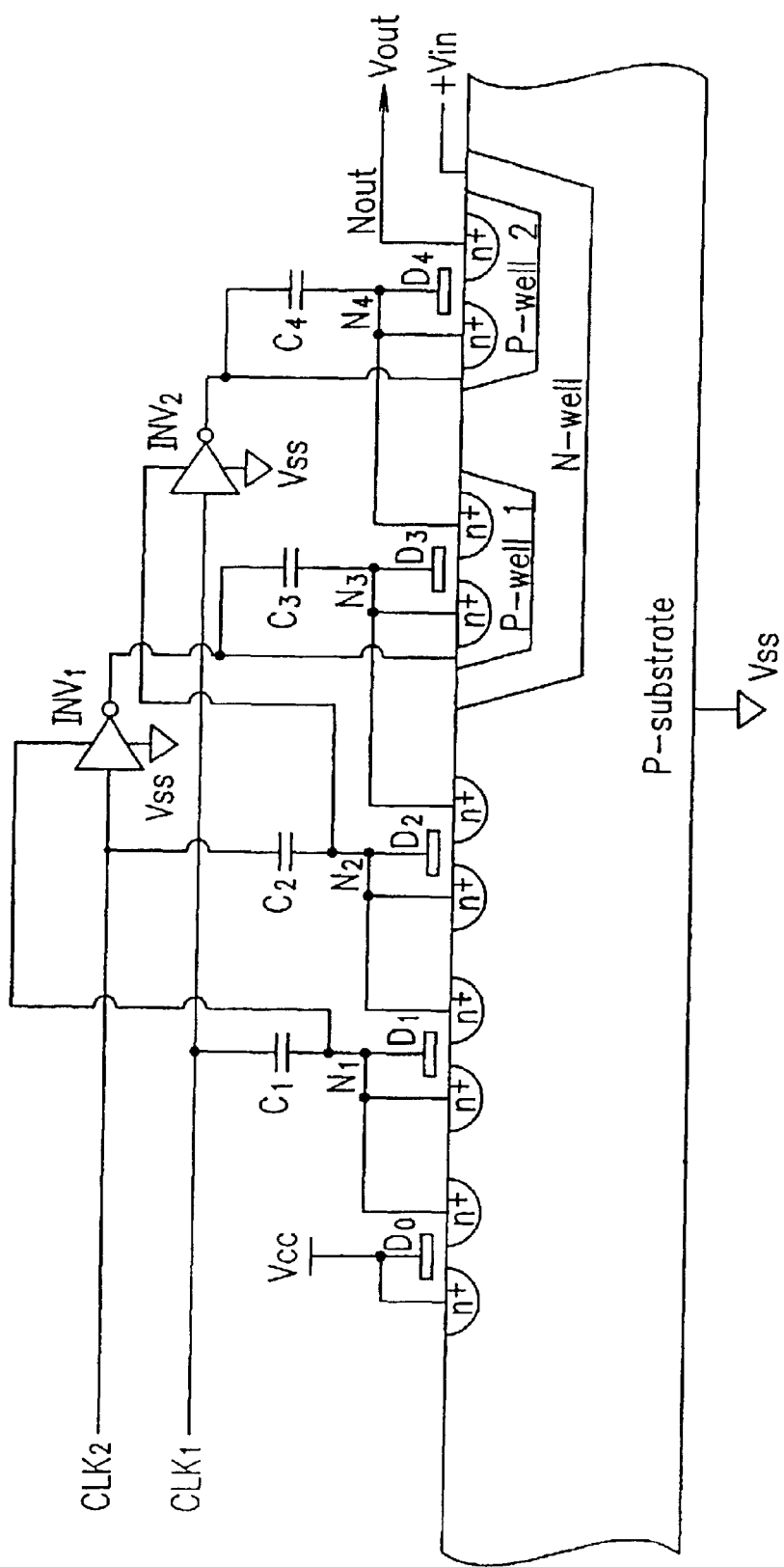
FIG. 3 shows another exemplary structure of the charge pump circuit shown in FIG. 1 together with a cross-sectional view of N-type MOS transistors D0 through D4.

In actuality, the capacitors C1 through C4, the inverters INV1 and INV2, and the lines connecting these elements are formed on the p-substrate. FIG. 2 does not show all of these elements, but rather mainly illustrates the triple structure, which is more relevant to the present invention. As a modification of the structure shown in FIG. 2, a structure shown in FIG. 3 may be adopted. In the case of the structure shown in FIG. 3, the N-type MOS transistors D0 through D2 are provided in and on the p-substrate, without being separated from the p-substrate by the n-well. The p-substrate has the reference voltage Vss (0 V). An n-well is provided so as to surround the p-wells including a source and a drain of the N-type MOS transistors D3 and D4.

Figure 4:
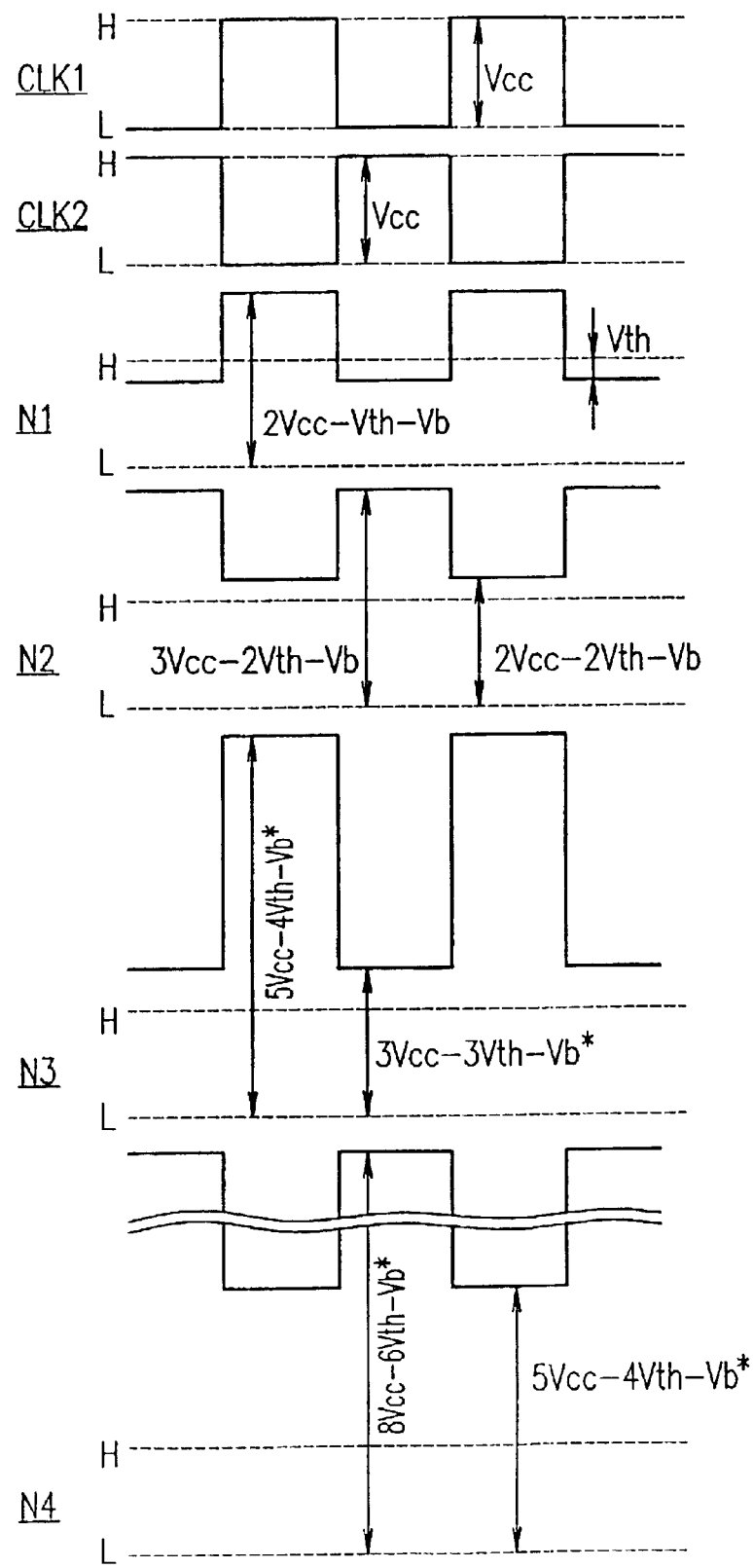
FIG. 4 is a timing diagram illustrating waveforms of voltages at various parts of the charge pump circuit shown in FIG. 1 for a pumping operation.

An exemplary operation of the charge pump circuit 10 having the above-described structure will be described with reference to FIG. 4. FIG. 4 is a timing diagram illustrating waveforms of the clock signals CLK1 and CLK2 and voltages at nodes N1 through N4. The nodes N1 through N4 are identical to those described in the conventional Dickson-type charge pump circuit. In the initial state, the voltage of each node is represented by expression (2).

When the voltage of the clock signal CLK1 is changed from 0 V to the supply voltage Vcc, the voltage at the node N1 is changed to 2Vcc−Vth, and the voltage 2Vcc−2Vth−Vb is transferred by the N-type MOS transistor D1 to the node N2 from the source of the N-type MOS transistor D1.

At this point, the clock signal CLK2 has been input to the input end of the inverter INV1. Namely, since the clock signal CLK2 is changed from the supply voltage Vcc to 0 V, the potential of the node N1 is transferred to the output end INV1_out of the inverter INV1 via the P-type MOS transistor included in the inverter INV1. The P-type MOS transistor in the inverter INV1 is in an ON state.

In the above-described manner, the potential of the output end INV1_out of the inverter INV1 is changed from 0 V to Vcc−Vth, which is equal to the voltage of the node N1. Namely, the voltage at the input end of the capacitor C3 is pumped from 0 V to 2Vcc−Vth.

At this point, the node N3 is charged with 3Vcc−3Vth−Vb as a result of being pumped by the two-stage pump circuits. The potential at the node N3 is pumped by the inverter INV2 from 3Vcc−3Vth−Vb, by 2Vcc−Vth, to 5Vcc−4Vth−Vb'. In this case, Vb>Vb', which indicates that the substrate biasing effect is reduced. "Vb'" represents a voltage drop of the transferred potential in the present invention.

The output end INV1_out of the inverter INV1 is connected to the p-well of the N-type MOS transistor D3, and thus reduces the substrate biasing effect more than in the conventional charge pump circuit in which the potential of the p-well is Vss (0 V). In the conventional Dickson-type charge pump circuit, the pumped-up voltage of the node N3 is 4Vcc−3Vth−Vb. In the charge pump circuit 10 in this example, the pumping efficiency is increased by a level corresponding to at least the voltage of Vcc−Vth. The pumping efficiency is further increased by the reduction in the substrate biasing efficiency due to Vb>Vb'.

Hereinafter, an exemplary operation of the charge pump circuit 10 will be described, mainly with regards to the inverter INV2.

The source of the N-type MOS transistor included in the inverter INV2 is connected to the node N2. When the voltage at the node N2 is pumped and the capacitor C2 is charged with the voltage of 3Vcc−2Vth−Vb, the potential of the capacitor C2 is output from the output end INV2_out of the inverter INV2 via the P-type MOS transistor included in the inverter INV2. In other words, the potential at the output end INV2_out of the inverter INV2 is changed from 0 V to 3Vcc−2Vth−Vb, and this potential is introduced into the input end of the capacitor C4. Namely, the voltage at the node 4 is pumped from 0 V by 3Vcc−2Vth−Vb.

The voltage at the node N4 is raised by the transfer of charges from the node N3: and as a result, the node N4 is charged with 5Vcc−4Vth−Vb. Therefore, the voltage at the node N4 is pumped from 5Vcc−4Vth−Vb by 3Vcc−2Vth−Vb. Theoretically, a voltage of 8Vcc−6Vth−Vb' is output as the output voltage Vout. In the conventional Dickson-type charge pump circuit, the output voltage Vout is 5Vcc−4Vth−Vb. The output voltage of the charge pump circuit 10 in this example is pumped by at least a voltage of 3Vcc−2Vth−Vb as compared to that of the conventional Dickson-type charge pump circuit. As can be appreciated from this, the pumping capability and the pumping efficiency are significantly improved.

In this case also, the p-well of the N-type MOS transistor D4 has a voltage of 3Vcc−2Vth−Vb which is obtained as a result of pumping. Thus, Vb>Vb', which indicates that the pumping efficiency is improved by the reduction in the substrate biasing effect.

In the first example, the charge pump circuit 10 includes N-type MOS transistor D0 for preventing backflow and four basic pump cells (MOS transistors Di and capacitors Ci). The number of stages of the basic pump cells is not limited to four, and the present invention is applicable to a charge pump circuit 10 including n-stages of basic pump cells, where "n" represents any integer of equal to or greater than three. In this case, the first-stage and the second-stage basic pump cells respectively include the N-type MOS transistors D1 and D2. The p-well surrounding the sources and the drains of the N-type MOS transistors D1 and D2 as well as the source and the drain of the N-type MOS transistor D0 for preventing backflow are connected to the reference power supply (reference voltage Vss). The third-stage pump cell includes an inverter INV3 (not shown), a MOS transistor D5 (not shown), and a capacitor C5 (not shown). An input end of the inverter INV3 receives a clock signal CLK2. An output of the inverter INV3 is connected to a p-well of the MOS transistor D5 and to an input end (a second end) of the capacitor C5. A high voltage power supply input end of the inverter INV3 is connected to the node N3, and a low voltage power supply input end of the inverter INV3 is connected to the reference power supply (reference voltage Vss: 0 V).

Where i is a natural number of 1, 2, 3, . . . , the i'th inverter INVi receives a clock signal CLK2 at an input end thereof when i is an odd number and receives a clock signal CLK1 at the input end thereof when i is an even number. An output from the inverter INVi is sent to a p-well of a MOS transistor Di+2 (not shown) and to an input end (a second end) of a capacitor Ci+2 (not shown). A high voltage power supply input end of the inverter INVi is connected to a node Ni, and a low voltage power supply input end of the inverter INVi is connected to a reference power supply (reference voltage Vss: 0 V).

In summary, in the first example, when a pumping operation is performed for sequentially increasing voltages of a plurality of nodes by transferring charges in accordance with two clock signals CLK1 and CLK2 having opposite phases to each other, a p-well of a MOS transistor included in one basic pump cell is supplied with a voltage obtained by pumping the voltage by a MOS transistor in the immediately previous stage at the corresponding phase. The same operation is performed with other clocks having different phases. The number of the other clocks having different phases is not limited to any specific number. Regardless of the number of the other clocks, a p-well of a MOS transistor is supplied with a voltage obtained by pumping the voltage by a MOS transistor in the immediately previous stage at the corresponding phase.

EXAMPLE 2

In the charge pump circuit 10 in the first example, the p-well of the N-type MOS transistors D1 and D2 are connected to the reference power supply (reference voltage Vss: 0 V). This may raise the threshold voltages of the N-type MOS transistors D1 and D2 due to the substrate biasing effect. In order to reduce the threshold voltages of the N-type MOS transistors D1 and D2 in addition to the threshold voltages of the N-type MOS transistors D3 and D4, the second example of the present invention provides the following structure.

Figure 5:
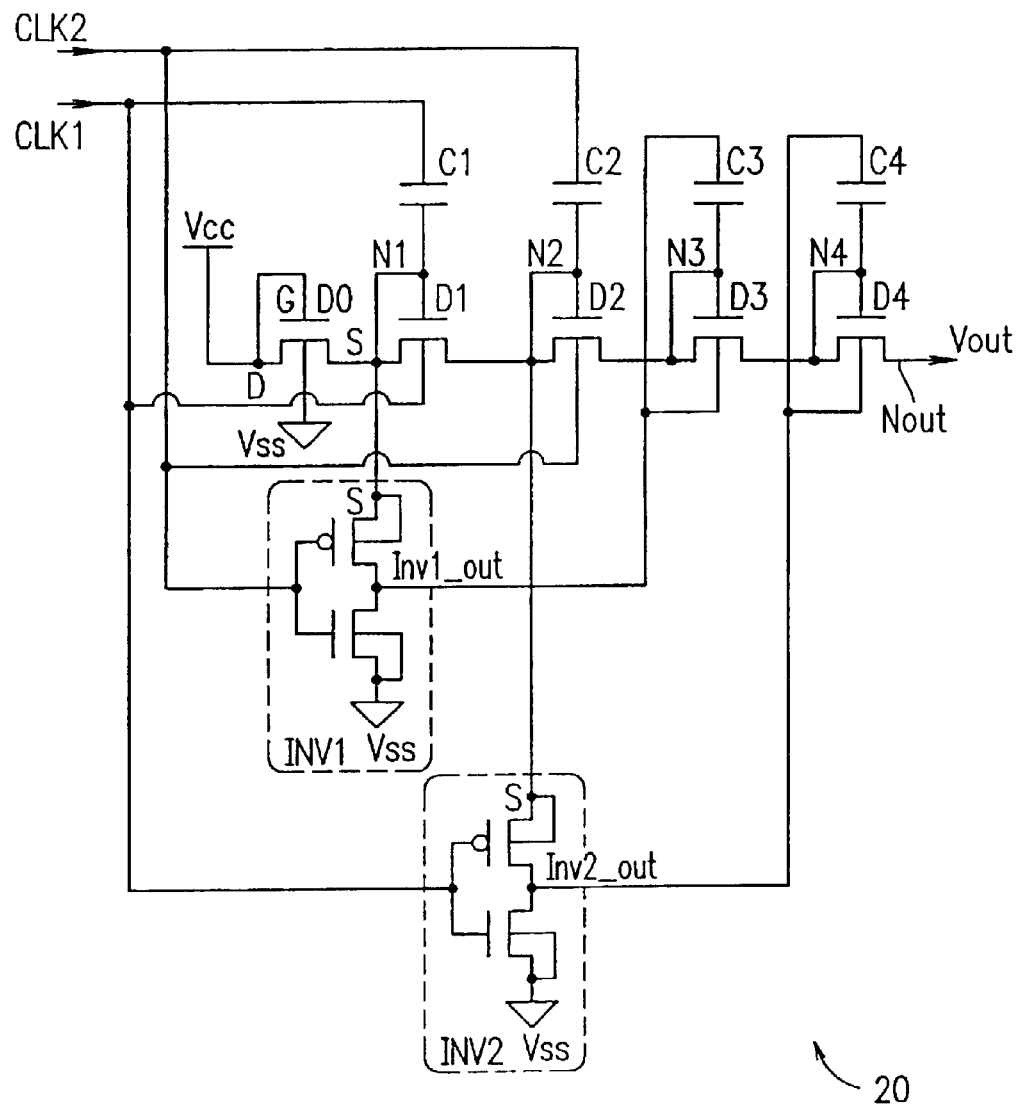
FIG. 5 is a circuit diagram illustrating a part of a semiconductor charge pump circuit according to a second example of the present invention.

FIG. 5 shows a configuration of a charge pump circuit 20 according to the second example of the present invention. As shown in FIG. 5, a clock signal CLK1 is input to the p-well of the N-type MOS transistor D1, and a clock signal CLK2 is input to the p-well of the N-type MOS transistor D2. Owing to such a structure, the threshold voltage is prevented from being raised by the substrate biasing effect.

The charge pump circuit 20 having the above-described structure operates, for example, as follows.

When the voltage of the clock signal CLK1 is changed from 0 V to the supply voltage Vcc, the voltage at the node N1 is changed to 2Vcc−Vth. At this point, the voltage of the p-well of the N-type MOS transistor D1 has reached the supply voltage Vcc in accordance with the clock CLK1. Therefore, the voltage of the p-well is also pumped, and the voltage of 2Vcc−2Vth−Vb'+Vcc is transferred by the N-type MOS transistor D2 from the source S of the N-type MOS transistor D2 to the node N2. As a result, the voltage is further raised while the substrate biasing effect is reduced. Thus, the pumping effect is increased.

The N-type MOS transistor D2, which receives the clock signal CLK2 at the p-well, enjoys an effect similar to that described above. The operation of the basic pump cells in the later stages are as described above in the first example. In other words, the pumped-up voltages at the N-type MOS transistors D1 and D2 are summed, and thus the voltages in the later-stage N-type MOS transistors are sequentially pumped.

In the second example, the number of stages of the basic pump cells is not limited to any specific number, and the N-type MOS transistors may have the structure as described in the first example.

In the first and second examples, the charge pump circuit includes inverters INV1 and INV2 as switching elements. Instead of the inverters, any type of switching elements are usable which switch the voltage either to the reference voltage Vss (0 V) or to a prescribed node voltage in accordance with whether the clock signals CLK1 and CLK2 are at a HIGH level or at a LOW level. For example, analog switches such as, for example, transmission gates are usable. The inverters described above are, however, one of the types of switching elements which can be most easily implemented.

In the first and second examples, each basic pump cell includes an N-type MOS transistor. Alternatively, each basic pump cell may include a P-type MOS transistor. In this case, an n-well may surround a source and a drain of one or a plurality of transistors. The present invention is also applicable to a structure using an n-substrate. In this case, the well may be of an n-type or a p-type in accordance with various other factors.

In the first and second examples, the present invention is applied to a positive high voltage charge pump. The present invention is applicable for generating a negative voltage, using a charge pump circuit, from the supply voltage Vcc along the same concept, i.e., the voltage is pumped by transferring a charge of −Q, instead of transferring a charge of +Q, through a change in capacitor connection.

EXAMPLE 3

Figure 6:
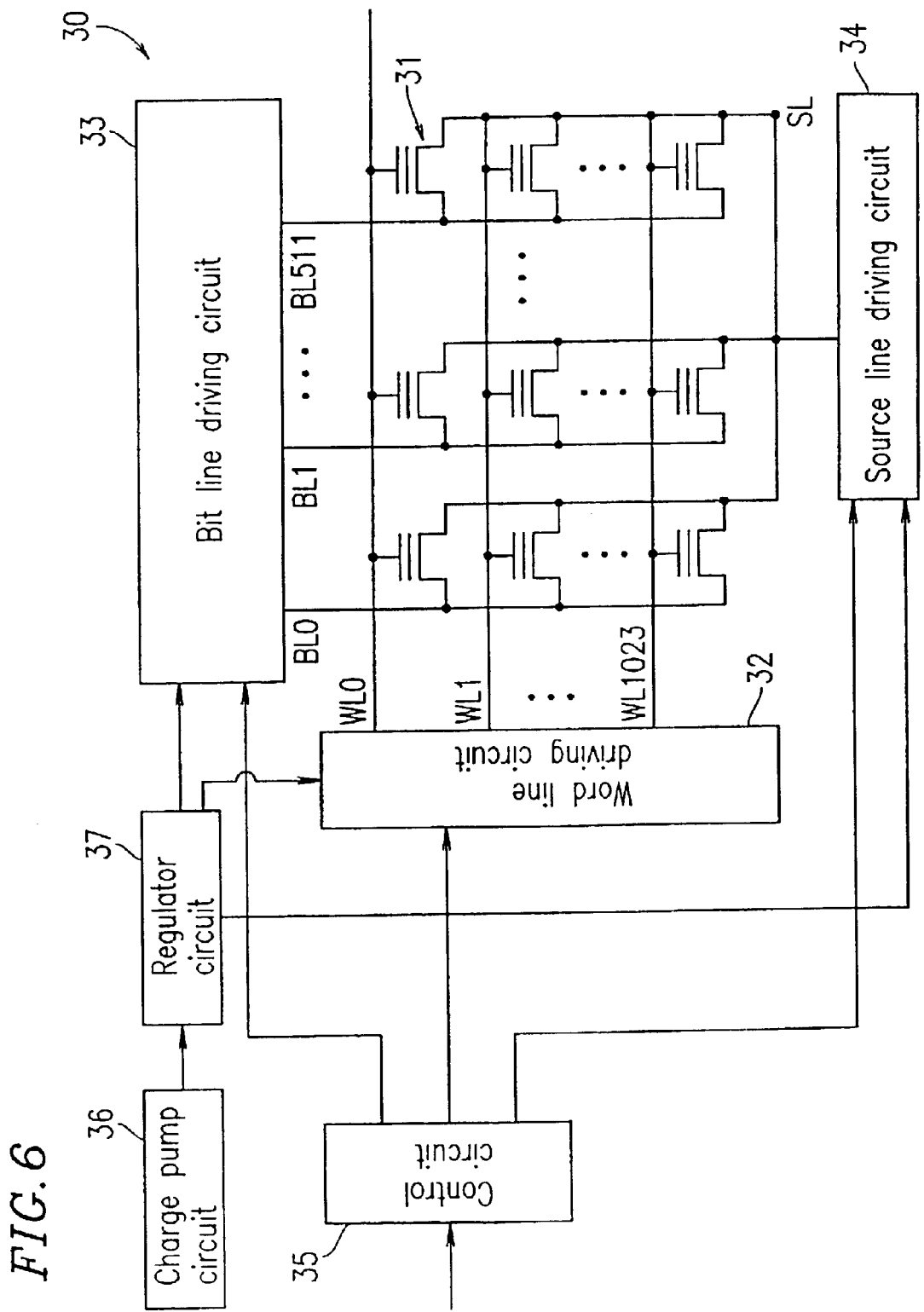
FIG. 6 is a block diagram illustrating a part of a flash memory according to a third example of the present invention.

In the-third example of the present invention, a semiconductor memory device, for example, a flash memory, including the charge pump circuit 10 or 20 described in the first and second examples will be described. FIG. 6 is a circuit diagram illustrating the structure of such a flash memory 30.

As shown in FIG. 6, the flash memory 30 includes a plurality of flash memory cells 31, a word line driving circuit 32, a bit line driving circuit 33, a source line driving circuit 34, a control circuit 35 for controlling the flash memory cells 31 and the driving circuits 32, 33 and 34, a charge pump circuit 36, and a regulator circuit 37.

The plurality of flash memory cells 31 are arranged in a matrix, i.e., in rows and columns. Although not shown in FIG. 6, a source S and a drain D are formed in a p-well in a p-substrate for each flash memory cell 31. An area of the p-substrate between the source S and the drain D (p-well) is overlain by a tunnel oxide layer. The tunnel oxide layer is overlain by a floating gate FG, which is in turn overlain by an interlayer insulating layer. The interlayer insulating layer is further overlain by a control gate CG. The control gates CG corresponding to each row of flash memory cells 31 are commonly connected to a corresponding word line WL out of a plurality of word lines WL. The drains of each column of flash memory cells 31 are commonly connected to a corresponding bit line BL out of a plurality of bit lines BL. The sources S of each block of flash memory cells 31 are commonly connected to a common source line SL. In the example shown in FIG. 6, one block includes word lines WL0 through WL1023 and bit lines BL0 though BL511, i.e., 64 kB.

The word line driving circuit 32 selectively drives one of the plurality of word lines WL, the bit line driving circuit 33 selectively drives one of the plurality of bit lines BL, and the source line driving circuit 34 drives the common source line SL.

The control circuit 35 receives a control signal from an external device to the flash memory 30, and decodes an address or generates a control signals, for example, a write signal, an erase signal or a read signal, based on the control signal.

The charge pump circuit 36 generates a driving voltage by pumping a supply voltage Vcc, like the charge pump circuits 10 and 20 described in the first and second examples.

The regulator circuit 37 stably supplies various driving voltages generated by the charge pump circuit 36 to the word line driving circuit 32, the bit line driving circuit 33 and the source line driving circuit 34.

Table 1 shows exemplary voltages which are applied to the flash memory cells 31 for performing data write, erase and read operations with respect to the flash memory 30 having the above-described structure.

TABLE 1

|  | Control gate | Drain | Source | Substrate (p-well) |
| --- | --- | --- | --- | --- |
| Write | −10 V | 6 V | 0 V | 0 V |
| Erase | −9 V | Open | 6 V | 0 V |
| Read | 5 V | 1 V | 0 V | 0 V |

The highest voltage among these voltages or a voltage higher than the highest voltage is generated by pumping the supply voltage Vcc using the charge pump circuit 36 according to the present invention. The generated driving voltages are input to the regulator circuit 37 so as to stabilize the output voltage of the regulator circuit 37. Various other types of voltages are also generated and output to the word line driving circuit 32, the bit line driving circuit 33 and the source line driving circuit 34 via the regulator circuit 37.

For example, the voltage applied to a word line WL and a bit line BL for data write, the voltage applied to the common source line SL for data erase, and the voltage applied to a word line WL for data read, all shown in Table 1, are generated by the charge pump circuit 36 (corresponding to each of the positive high voltage charge pump circuits 10 and 20 shown in FIGS. 1 and 5). The word line driving circuit 32, the bit line driving circuit 33 and the source line driving circuit 34 are controlled by the control circuit 35 so as to apply the above-mentioned voltages to the word line WL, the bit line BL, and the common source line SL of the flash memory 30. Thus, data write, erase and read are performed.

As described above, a charge pump circuit according to the present invention is easily applicable to a nonvolatile semiconductor memory device using various types of pumped-up voltages.

A charge pump circuit according to the present invention includes inverters INV1 and INV2. The inverter INV1 receives a clock signal CLK2, and applies, as a clock, a voltage waveform at the node N1 in the immediately previous stage to an input end (a second end) of the capacitor C3 connected to the transistor D3 and to the p-well of the transistor D3. The voltage of the capacitor C3 on the side of the control terminal of the N-type MOS transistor D3 connected to the capacitor C3 is raised with the same phase timing as that of the clock signal CLK1. The voltage waveform at the node N1 is also raised with the same phase timing as that of the clock signal CLK1.

The inverter INV2 receives a clock signal CLK1, and applies, as a clock, a voltage waveform at the node N2 in the immediately previous stage to an input end of the capacitor C4 connected to the transistor D4 and to the p-well of the transistor D4. The voltage of the capacitor C4 on the side of the control terminal of the N-type MOS transistor D4 connected to the capacitor C4 is raised with the same phase timing as that of the clock signal CLK2. The voltage waveform at the node N2 is also raised with the same phase timing as that of the clock signal CLK2.

Owing to such a structure, the pumping capability is increased and the pumping efficiency is enhanced. This can drastically reduce the number of capacitors and thus reduce the area required for the semiconductor chip. This significantly contributes to the size reduction of the EEPROMs and flash memory chips.

Figure 7:
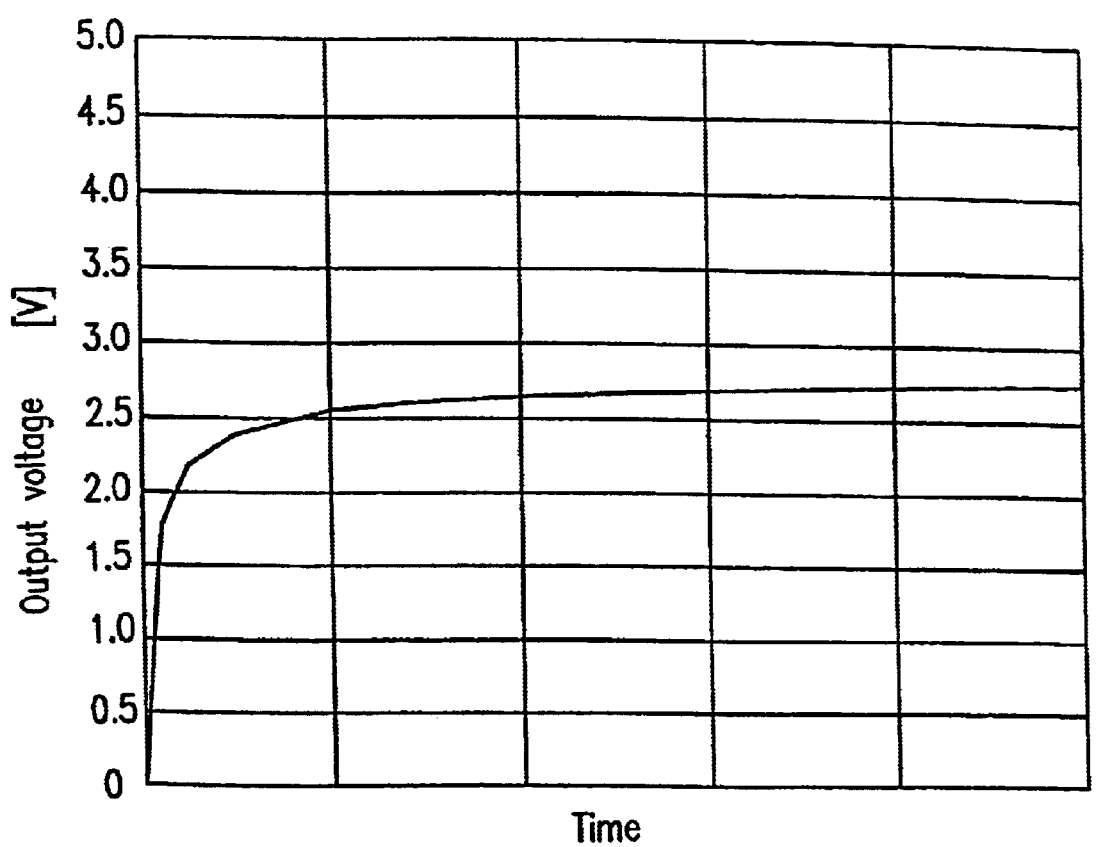
FIG. 7 is a graph illustrating a voltage rise in a conventional Dickson-type charge pump circuit.
Figure 8:
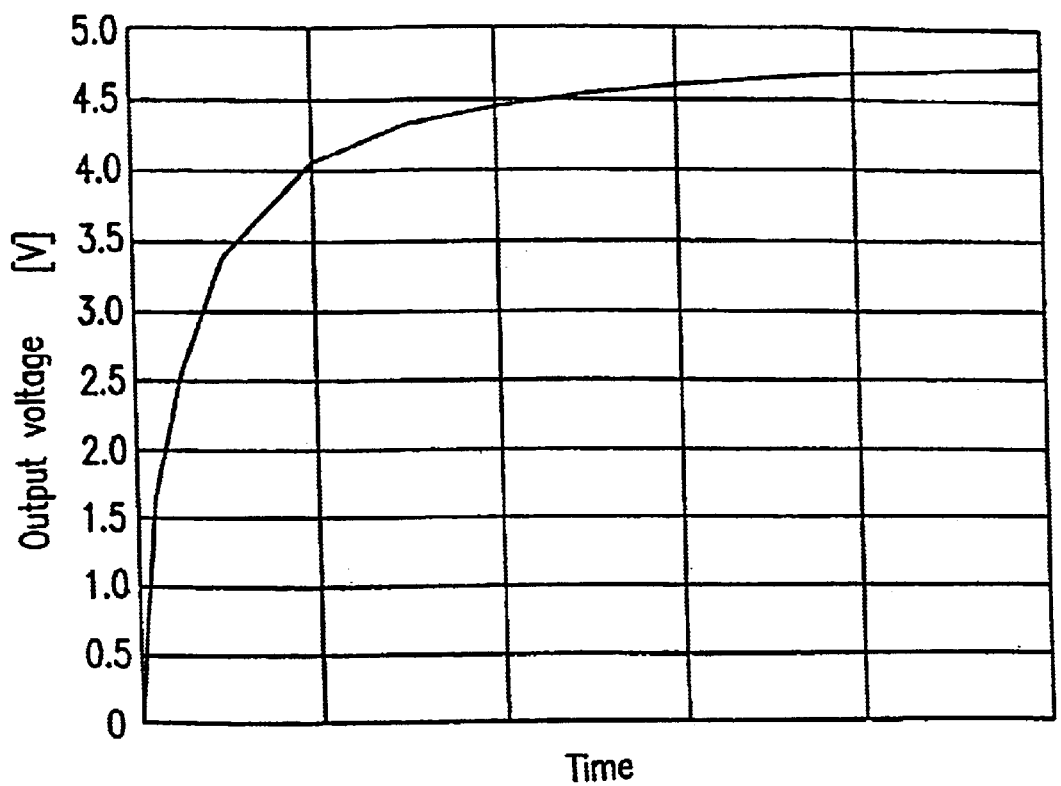
FIG. 8 is a graph illustrating a voltage rise in the charge pump circuit shown in FIG. 1 or 5.
Figure 9:
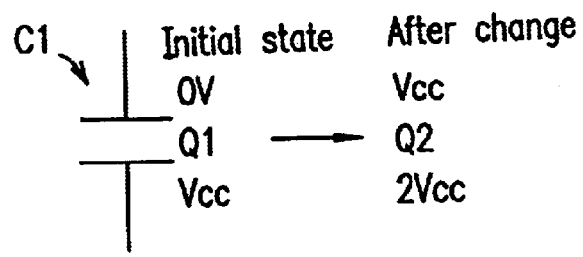
FIG. 9 shows a basic principle of operation of a charge pump circuit.

Specifically, in the conventional Dickson-type charge pump circuit (shown in FIG. 10; including four-stage basic pump cells which are not for preventing the backflow), the threshold voltage is raised by the substrate biasing effect. Therefore, even when the supply voltage Vcc (1.5 V) is raised over a sufficient time period, an output voltage Vout of merely about 2.7 V is obtained as shown in FIG. 7. By contrast, in the charge pump circuits 10 and 20 in the first and second examples (including four-stage basic pump cells which are not for preventing the backflow), the threshold voltage is prevented from being raised by the substrate biasing effect and the pumping capability is increased. Therefore, when the supply voltage Vcc (1.5 V) is pumped, an output voltage of about 4.7 V is obtained as shown in FIG. 8. This level of voltage is about 1.7 times the level of the voltage obtained in the conventional Dickson-type charge pump circuit.

As described above, according to the present invention, (i) an input end (a second end) of a capacitor connected to a control terminal of a transistor and (ii) a well, in the substrate, of the transistor are both supplied with a voltage waveform of an immediately previous stage as a clock during a pumping operation, the voltage waveform being raised with the same phase timing as the voltage of the capacitor on the side of the control terminal of the N-type MOS transistor connected to the capacitor. Therefore, the transfer efficiency of the pumping voltage is improved over the conventional Dickson-type charge pump circuit, and the pumping operation can be performed efficiently even at a low voltage power supply.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor charge pump circuit, comprising:
   basic pump cells connected in N stages where N is a natural number of equal to or greater than three, wherein:
   each cell is formed by connecting a control terminal of a transistor and a first driving terminal of the transistor and connecting the control terminal and a first end of a capacitor,
   the basic pump cells are connected in N stages by connecting a second driving terminal of a transistor of one basic pump cell to a first driving terminal of a transistor of a next-stage basic pump cell,
   a second end of the capacitor of each basic pump cell receives a clock having a different phase from a clock which is input to the capacitor of an immediately previous-stage basic pump cell and the capacitor of an immediately subsequent-stage basic pump cell,
   the basic pump cells connected in N stages are driven at a plurality of phase timings so as to pump a voltage,
   the transistor of at least one of the basic pump cells includes a substrate well, and
   the semiconductor charge pump circuit further includes a switching element for applying, as the clock, a voltage waveform from the basic pump cell, immediately previous to the switching element, to the second of the capacitor connected to the control end of the transistor including the substrate well and to the substrate well of the transistor during a pumping operation, the voltage waveform being pumped with the same phase timing of that of the voltage of the capacitor on the side of the control terminal of the transistor connected to the capacitor.

2. A semiconductor charge pump circuit according to claim 1, wherein:
   the basic pump cells connected in N stages include a group of basic pump cells operating with the same timing as each other, and
   an externally input basic clock for transfer is applied, as a voltage waveform, to a substrate well of a transistor, and to a second end of a capacitor, of a first-stage basic pump cell of the group of basic pump cells.

3. A semiconductor charge pump circuit according to claim 2, wherein two-phase clocks having opposite phases to each other are used.

4. A semiconductor charge pump circuit according to claim 1, wherein two-phase clocks having opposite phases to each other are used.

5. A semiconductor charge pump circuit according to claim 1, wherein the switching element is an inverter circuit including a P-type MOS transistor and an N-type MOS transistor, and switches between the voltage waveform of the basic pump cell immediately previous to the inverter circuit and a reference voltage, in accordance with the level of the clock provided to the basic pump cell immediately previous to the inverter circuit.

6. A semiconductor charge pump circuit according to claim 5, wherein a difference between (i) a voltage applied to at least one of the substrate well of the transistor or the second end of the capacitor connected to the transistor during the pumping operation, and (ii) the voltage pumped with the same phase timing as the voltage is restricted up to a threshold voltage of the P-type MOS transistor.

7. A semiconductor charge pump circuit according to claim 1, wherein the basic pump cells connected in N stages include at least one basic pump cell, having an N-type MOS transistor formed in and on a p-substrate, and at least one basic pump cell, having an N-type MOS transistor formed in and on a p-well which is electrically separated from the p-substrate.

8. A semiconductor charge pump circuit according to claim 7, which has a triple-well structure in which the p-well is surrounded by an n-well so as to be separated from the p-substrate, the semiconductor charge pump circuit further comprising at least one transistor in and on the p-substrate.

9. A nonvolatile semiconductor memory device comprising a semiconductor charge pump circuit according to claim 1.

* * * * *